United States Patent [19]

Grüning

[11] Patent Number: 5,150,287
[45] Date of Patent: Sep. 22, 1992

[54] QUARTER-BRIDGE CIRCUIT FOR HIGH CURRENTS

[75] Inventor: Horst Grüning, Wettingen, Switzerland

[73] Assignee: Asea Brown Boveri Ltd., Baden, Switzerland

[21] Appl. No.: 733,889

[22] Filed: Jul. 22, 1991

[30] Foreign Application Priority Data

Aug. 2, 1990 [EP] European Pat. Off. ........ 90114824.7

[51] Int. Cl.$^5$ .......................................... H02M 7/515
[52] U.S. Cl. .................................. 363/135; 363/136; 363/137
[58] Field of Search ................ 363/27, 28, 71, 96, 363/135, 136, 137

[56] References Cited

U.S. PATENT DOCUMENTS

| 4,370,607 | 1/1983 | Dassonville | 363/68 |
| 4,612,561 | 9/1986 | Kimura et al. | 363/70 |
| 4,733,146 | 3/1988 | Hamby | 363/137 |
| 4,805,081 | 2/1989 | Chambers et al. | 363/71 |
| 4,924,370 | 5/1990 | Toelle | 363/96 |
| 4,951,187 | 8/1990 | Stemmler | 363/71 |
| 4,965,709 | 10/1990 | Ngo | 363/137 |
| 5,031,088 | 7/1991 | Tanaka | 363/96 |
| 5,051,603 | 9/1991 | Walker | 363/137 |

FOREIGN PATENT DOCUMENTS

| 0039279 | 11/1981 | European Pat. Off. |
| 0185181 | 6/1986 | European Pat. Off. |
| 0260471 | 3/1988 | European Pat. Off. |
| 3322641 | 1/1984 | Fed. Rep. of Germany |
| 1940/905 | 8/1990 | Switzerland |

OTHER PUBLICATIONS

Japanese Abstract; JP-A-61-95610, May 14, 1986.
ETG-Fachbericht; 23, pp. 305-314, May 4-5, 1988, Friedrich Speth, "Spezifikation Von Pulsumrichtern fur Industrieanwendungen".
Fuji Electric Corporate Research and Development Ltd.; pp. 421-427, Hideo Saotome, et al., "High Voltage GTO-Inverter Using Reverse Conducting GTO-Thyristor", Jun. 1991.

Primary Examiner—William H. Beha, Jr.
Assistant Examiner—Jeffrey Sterrett
Attorney, Agent, or Firm—Oblon, Spivak, McClelland, Maier & Neustadt

[57] ABSTRACT

In a quarter-bridge circuit for high currents the total current is subdivided into a plurality of parallel current paths. In each current path a semiconductor component (5.1, ..., 5.n, 6.1, ..., 6.n) that can be turned off via a gate, a freewheeling diode (7.1, ..., 7.n, 8.1, ..., 8.n) located opposite a midpoint, and a clamping capacitor (9.1, ..., 9.n, 10.1, ..., 10.n) are arranged in parallel with the freewheeling diode (7.1, ... 7.n, 8.1, ..., 8.n) and the turnoff semiconductor component (9.1, ..., 9.n, 10.1, ..., 10.n) in such a way that the respective freewheeling path has as minimal an inductance as possible. Provided between a load terminal (3) of the quarter-bridge circuit and each midpoint of a current path is one inductor (L11.1, ..., L11.n, L21., ..., L21.n) each which limits the rate of current rise, so that a current rush caused by an operating delay does not overload the turnoff semiconductor component (9.1, ..., 9.n, 10.1, ..., 10.n). Each current path is preferably realized by means of a separate module. The quarter-bridge is suitable for series connection, equally as a part of a bridge circuit or of a chopper.

10 Claims, 3 Drawing Sheets

QUARTER-BRIDGE CIRCUIT FOR HIGH CURRENTS

BACKGROUND OF THE INVENTION

1. Field of the Invention

The invention relates to a quarter-bridge circuit for high currents, comprising a plurality of semiconductor components that can be turned off via a gate in each case and one freewheeling diode each, located opposite a midpoint, so that a total current in the quarter-bridge circuit is subdivided into a plurality of parallel current paths.

2. Discussion of Background

The intensive research in the field of power electronics has produced a large number of diverse component types. Of particular interest in this regard are those new switches which permit low-power and fast triggering. To date, however, only those components that require a complicated snubber network (e.g. GTO) continue to be available to the user for turning off high currents.

A further development of the known, user-friendly, finely structured components toward higher switching capacities harbors a number of imponderables and cost factors:

1. Higher powers cause larger chip surfaces and correspondingly larger contact surfaces. The problems which arise in the pressure contacting (necessary for large-area components) of the finest structures are not easy to grasp.
2. The housing and clamping system are complicated and expensive for large components.
3. The installation of the required, low-inductive triggering in the pressure contact housing is problematic.
4. With rising current intensity in the circuit, there is a rise in the risk of undesired electromagnetic interference (EMI=electromagnetic interference).
5. Leakage inductances in the load circuit can effect large overvoltage peaks with the reverse recovery of the diodes.
6. A consequence of an enlargement of the semiconductor switches is a reduction in yield during production. This disadvantage can be eliminated only partially using the so-called wafer repair technology.

There is no lack of attempts to overcome these problems, but nevertheless users have long wished to be able to control high powers with a low outlay on circuitry.

It must not be forgotten in the entire problem of powerful semiconductor components, however, that the user must have available a module in which the desired switch element (semiconductor chip) is packed in as user-friendly a fashion as possible. To achieve this does not mean to make available a semiconductor switch for high currents. Rather, the power semiconductor should be developed with regard to an advantageous module construction. In so doing, it is necessary to keep in view the most important circuit arrangements in the corresponding power range. These include, for example, bridge circuits for inverters, chopper circuits and the like.

The report "Abschaltbare Elemente der Leistungselektronik und ihre Anwendungen" ("Turnoff elements in power electronics and their applications"), Friedrich Speth, ETG Symposium 4th/5th May 1988, ETG Technical Report 23, pages 305–314 discloses the use of transistor modules which comprise a freewheeling diode in addition to the turnoff semiconductor component. The purpose of this connection is to keep the inductances as low as possible.

In order to widen the power range it is, moreover, proposed to connect a plurality of identical transistor modules in parallel. It is advantageous in this regard, for example, to connect emitter, collector and base by means of one low-inductive conductor rail in each case.

With GTOs, the situation is completely different. They are not connected in parallel, because the danger exists that given the slightest operating delays in individual components the current in the others becomes too high. However, even in conventional threephase converters problems can occur with the overcurrent if, for example, the electronic overcurrent protective devices fail. For this case, the named publication proposes to provide in the supply line a fuse which, given the occurrence of a fault in one branch, is blown by purposive firing of the remaining branches. The great disadvantage of this measure consists in that the entire converter is immediately put out of action.

The publication "High Voltage GTO Inverter Using Reverse Conducting GTO-Thyristor" by H. Saotome and S. Konishic discloses an inverter circuit having GTOs connected in series. Saturating inductances are provided in the lead in order to reduce the loading of the GTOs.

SUMMARY OF THE INVENTION

Accordingly, the object of the invention is to provide a novel quarter-bridge circuit of the type named at the beginning which permits a high operational reliability in conjunction with a high load current and can be realized with the smallest possible outlay.

The solution according to the invention consists in that a) for each current path essentially one assigned clamping capacitor is arranged in parallel with the freewheeling diode and the turnoff semiconductor component in such a way that the respective freewheeling path has as minimal an inductance as possible overall, and b) there is provided between a load terminal of the quarter-bridge circuit and each midpoint of the current paths one inductor each which limits the rate of current rise, so that a current rush caused by an operating delay does not overload the turnoff semiconductor component.

The essence of the invention consists in that the total current is switched not by one large power component, but by a plurality of smaller power components arranged in parallel in a suitable fashion, and that at the same time the parallel freewheeling paths are loaded with a minimal inductance. Moreover, each current path has available its own freewheeling diode and at least an assigned, preferably however its own, di/dt clamp. The inductor limiting the rate of current rise guarantees reliable operation despite unavoidable asynchronisms during switching.

The advantage of the arrangement according to the invention resides in that by comparison with the prior art distinctly smaller overvoltages occur. Due to the fact that the chips (semiconductor components, ceramic capacitors) are smaller than in the case of high-current design, the loop becomes smaller per module. At the same time, the current is subdivided into a plurality of paths (modules), so that less current flows in the individual (in the final analysis, unavoidable) loops.

The said inductors preferably also perform the function of a back-up fuse. In this case, the inductor is dimensioned in each case such that in the event of a short circuit the current does not exceed the maximum turnoff current within the time span given by the detection time and the operating delay. It is therefore possible to dispense with a separate, external back-up fuse. The integrated back-up fuse can thus react rapidly and purposively.

A further advantageous measure consists in providing a conventional fuse in each current path between the midpoint and the load terminal. That is to say, if a semiconductor switch becomes defective for any reason and correspondingly loses its blocking ability, the associated fuse blows and thus eliminates the defective current path. However, because of the redundancy provided in practice, the entire circuit arrangement can continue to exercise the desired function.

A particularly simple triggering of the bridge circuit results when the turnoff semiconductor components belonging to the same quarter-bridge arm are triggered by a common gate unit that is electrically isolated with regard to the particular gate.

In order to guarantee a balanced static current distribution in the parallel current paths, a resistor can be provided, for example in series in each case with the current-limiting inductor. Its value is dimensioned such that at full load a voltage drop of 0.1 to 1 V, preferably 0.2 to 0.5 V, results.

The resistor is preferably at least partially formed by a fuse. Consequently, in the case of a defect in a current path the total failure of the arrangement can be avoided.

The invention is also particularly suitable in conjunction with the cascode circuit disclosed by the publication EP 0,260,471, in which at least one MOSFET, a zener diode and a capacitor in parallel with the diode are provided between the gate and the cathode of the high-power bipolar element (GTO, FSGTO, FCTh etc.). In this arrangement, the resistor for the static power distribution is formed by the channel of the low-voltage MOSFET (i.e. the resistance and temperature dependence thereof). The MOSFET thus fulfills two functions simultaneously. Furthermore, because of the relatively low power per current path the cascode circuit can be used economically, i.e. relatively small MOSFETs suffice.

A particularly simple monitoring of the bridge circuit results when for the purpose of detecting the loading of a turnoff semiconductor component means are provided which measure the voltage present at the respective inductor. This monitoring takes place in the immediate vicinity of the circuit-breaker and can be realized with a low outlay.

In the invention, FCThs (field-controlled thyristor) and CFCThs (complementary field-controlled thyristor), respectively are preferably used as turnoff semiconductor components. These components, which do not limit the current, can be triggered very rapidly (hard). The complicated snubber networks can thus be eliminated.

In order to minimize the inductance between the parallel current paths, the corresponding turnoff semiconductor components of a quarter-bridge arm are mounted with a non-structured main electrode on a common current rail. The FCThs of the HS arm (high side) are soldered with their anode side on the positive supply rail, and the CFCThs of the LS arm (low side) are soldered with their cathode side to the negative supply rail. The components (turnoff semiconductor components, freewheeling diodes, clamping capacitors) of the parallel current paths are accommodated unenclosed in a common housing with good mutual thermal contact. This embodiment permits simple cooling. Because of the low-inductance parallel connection, it is not necessary in this case to provide a separate clamping capacitor for each semiconductor component. In other words, there is no strict assignment between the capacitors and the current paths. This relaxation of the rule is possible because of the low inductance between the current paths. It is thus correspondingly possible to provide fewer clamping capacitors than circuit-breakers or freewheeling diodes.

A central circuit arrangement in the upper power range represents the bridge circuit, such as described, for example, in Swiss Patent Application CH-2106/90, not publised prior to the date of filing the present application.

It is an essential aspect of the arrangement according to the invention that the known half-bridge circuit is subdivided into two mutually isolated quarter-bridge arms. According to the invention, each quarter-bridge is composed of a plurality of parallel modules. In turn, each module comprises a turnoff semiconductor component, a freewheeling diode located opposite and a clamping capacitor. These three elements are arranged next to one another in space and connected in a low-inductive fashion.

Advantageous series circuits can be realized using the modules according to the invention. The cascode circuit, above all, has a real advantage in this regard since, because of the low control power, it is not necessary to provide the gates, which are at different potentials, with their own supply units. The cascode suitable for the invention is known from EP-0,260,471.

Further suitable embodiments follow from a consideration of the parallel application "Inverter mit Ueberstromschutz" ("Inverter with overcurrent protection"), which has been filed by the applicant on the same day naming the same inventor. The content of the parallel application is hereby to be held as included in the present description.

Further advantageous embodiments follow from the totality of the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1A:
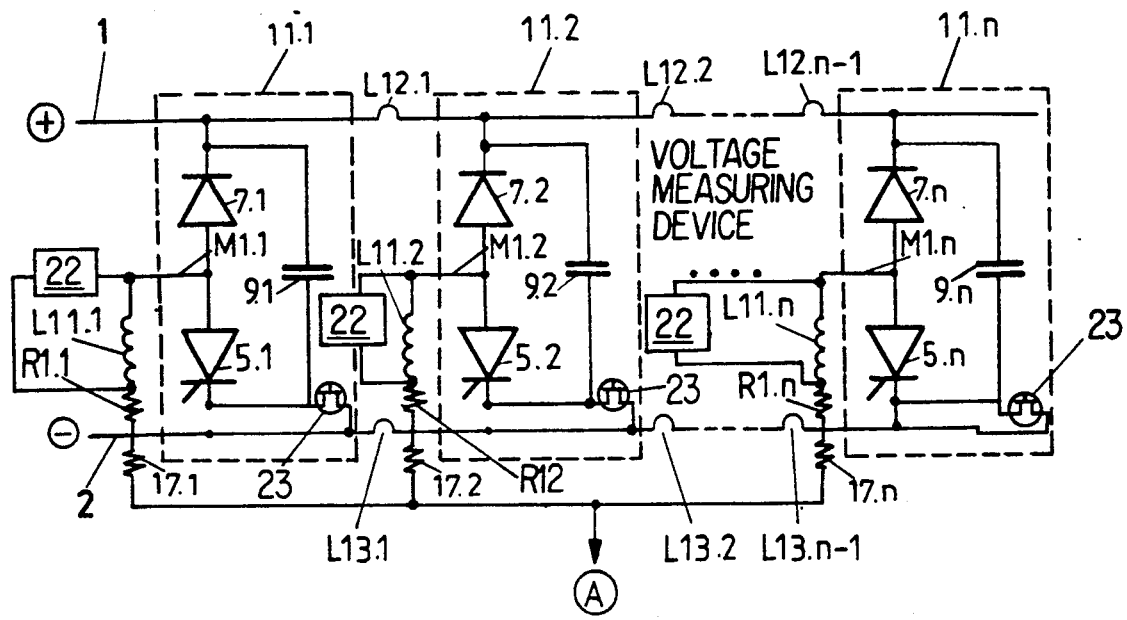
FIGS. 1a, b show a circuit arrangement for a bridge circuit that is constructed using separate modules with FCThs.

The reference numerals used in the drawings are listed in summary together with their meanings in the list of designations.

DESCRIPTION OF THE PREFERRED EMBODIMENTS

Referring now to the drawings, wherein like reference numerals designate identical or corresponding parts throughout the several views, FIGS. 1a, b show a first exemplary embodiment of a bridge circuit according to the invention. The input side of the circuit is formed by a positive and a negative supply line 1 and 2, respectively. Available on the output side is a load terminal 3 at which, for example, one of the three phases required by a three-phase motor is output as the load 4.

Figure 1B:
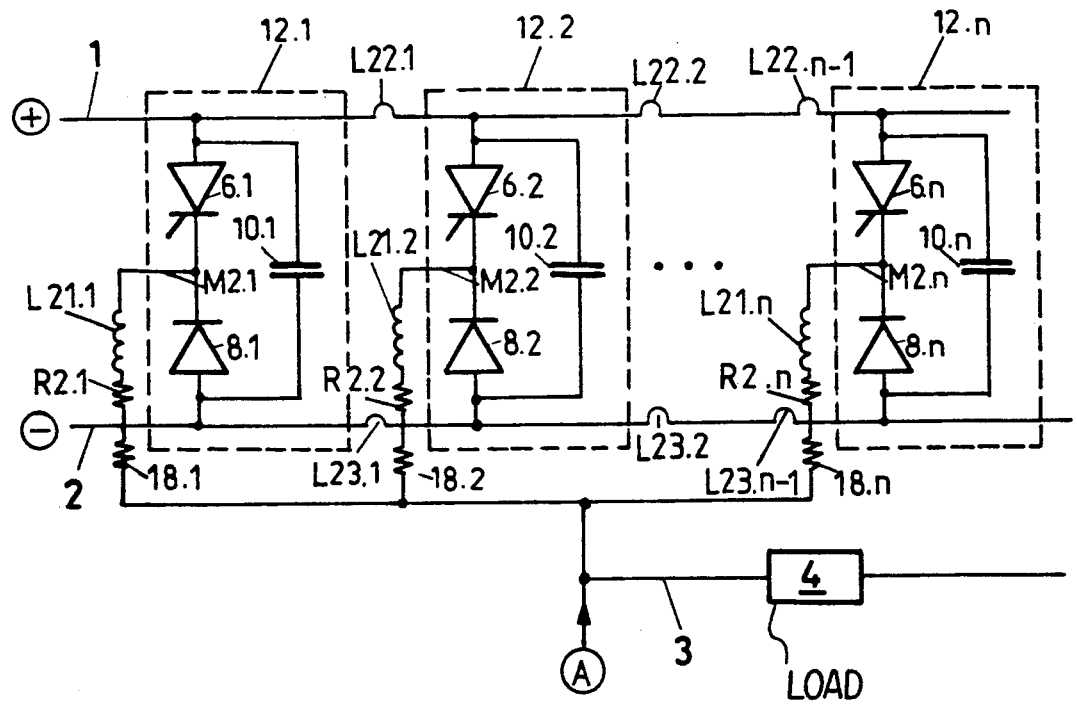

The half bridge shown in FIGS. 1a, b is subdivided into two quarter-bridge arms. The quarter-bridge arm shown in FIG. 1b is designated below as the HS arm (high side), and that shown in FIG. 1a as the LS arm (low side). The aim of this notation is to indicate whether the turnoff semiconductor components are connected to the positive or to the negative supply line.

In accordance with a characteristic of the invention, the total current to be processed (i.e the current output through the bridge circuit as a whole at the load 4) is subdivided into a plurality of parallel current paths. Each current path comprises at least one semiconductor component 5.1 and 5.2, ..., 5.n, respectively, 6.1 and 6.2, ..., 6.n, respectively, a freewheeling diode 7.1 and 7.2, ..., 7.n, respectively, 8.1 and 8.2, ..., 8.n, respectively, and a clamping capacitor 9.1 and 9.2, ..., 9.n, respectively, 10.1 and 10.2, ..., 10.n, respectively. The quarter-bridge arms are thus grouped into a certain number of LS and HS modules 11.1, 11.2, ..., 11.n and 12.1, 12.2, ..., 12.n, respectively.

With regard to better understanding, reference will be made below to only one (i.e. the first current path ". . . 1"). Corresponding statements hold for the remainder, as a rule.

The semiconductor component 5.1 is connected with its cathode in the LS module 11.1 to the negative supply line 2. Located on the anode side is the midpoint M1.1 (output to the load terminal 3) of the module. Located opposite this midpoint M1.1 is the freewheeling diode 7.1, which is hooked up with its cathode to the positive supply line 1. The clamping capacitor 9.1 is arranged in parallel with the semiconductor component 5.1 and the freewheeling diode 7.1 in order to absorb the reverse recovery voltage peaks.

The three components 5.1, 7.1 and 9.1 are arranged next to one another in space and contacted using low-inductive connections, so that the corresponding freewheeling path has a minimal inductance. It is preferable for the module 11.1 to be constructed as described in Swiss Patent Application CH-2106/90, not published prior to the date of filing the present application.

The HS module 12.1 differs from the LS module 11.1 in that the semiconductor component 6.1 and the freewheeling diode 8.1 are exchanged in their position. Thus, here the turnoff semiconductor component 6.1 is connected with its anode directly to the positive supply line. Otherwise what was said for the LS module 11.1 holds mutatis mutandis.

In accordance with a particularly advantageous embodiment, a low inductor L11.1, ..., L11.n, L21.1, ..., L21.n is arranged between the load terminal 3 and every midpoint of the current arms (HS and LS modules). In accordance with the invention, these can take on a plurality of functions.

The first task of the inductor L11.1 consists in balancing the transient current distribution. Since the semiconductor components have a certain mutual parameter dispersion, and since also the triggering cannot be absolutely synchronous, it is unavoidable that, for example upon turnoff, not all the components simultaneously enter the blocking state. Rather, a non-negligible time delay will occur between the majority of the modules and a straggler. During this time, the current is concentrated on the individual component and the few components still turned on, respectively.

The inductor L11.1 is chosen precisely so large that these differences between turn-on and turnoff cannot exert any noticeable influence on the transient current distribution. In other words: a current rise caused by an operating delay of the type mentioned is so strongly braked that the turnoff semiconductor component is not overloaded. Concrete values can be readily determined using this rule, given that in practical application both the maximum time delay to be expected and the voltages occurring are known.

In accordance with a particularly preferred embodiment, the inductor L11.1 also fulfills a second function, to be precise that of the back-up fuse. When, because of a short circuit, the current rises sharply, this defect must first be recognized, and the semiconductor component must then be turned off. Both the detection of a short circuit and the turning off require a certain time. Starting from the basic load (in the individual current path) the current must not rise during this time above the maximum turnoff limit current.

The detection of the overcurrent preferably takes place separately in each module. For example, means can be provided in order to measure the voltage present at the inductor L11.1. As is known, this voltage is proportional to the time change of the current. The current can thus be measured by a simple time integration of the said voltage.

The overcurrent function must, of course, be designed such that it is not triggered by the turn-on and turnoff delay, (i.e. uneven transient current distribution), respectively.

The inductors L11.1 etc. that are arranged between the midpoints M1.1, ..., M1.n, M2.1, ..., M2.n of the parallel modules 11.1, ..., 11.n, 12.1, ..., 12.n are typically situated within the range of a few $\mu H$, assuming that a module switches 200 A and blocks approximately 2.5 kV.

The input-side connection is to be as low-inductive as possible between the individual modules. This means that the inductors L12.1, L12.2, ..., L12.n−1 and L22.1, L22.2, ..., L22.n−1, respectively, in the positive supply line 1, and the inductors L13.1, L13.2, ..., L13.n−1 and L23.1, L23.2, ..., L23.n−1, respectively, in the negative supply line 2 are to be kept as small as possible.

Figure 2A:
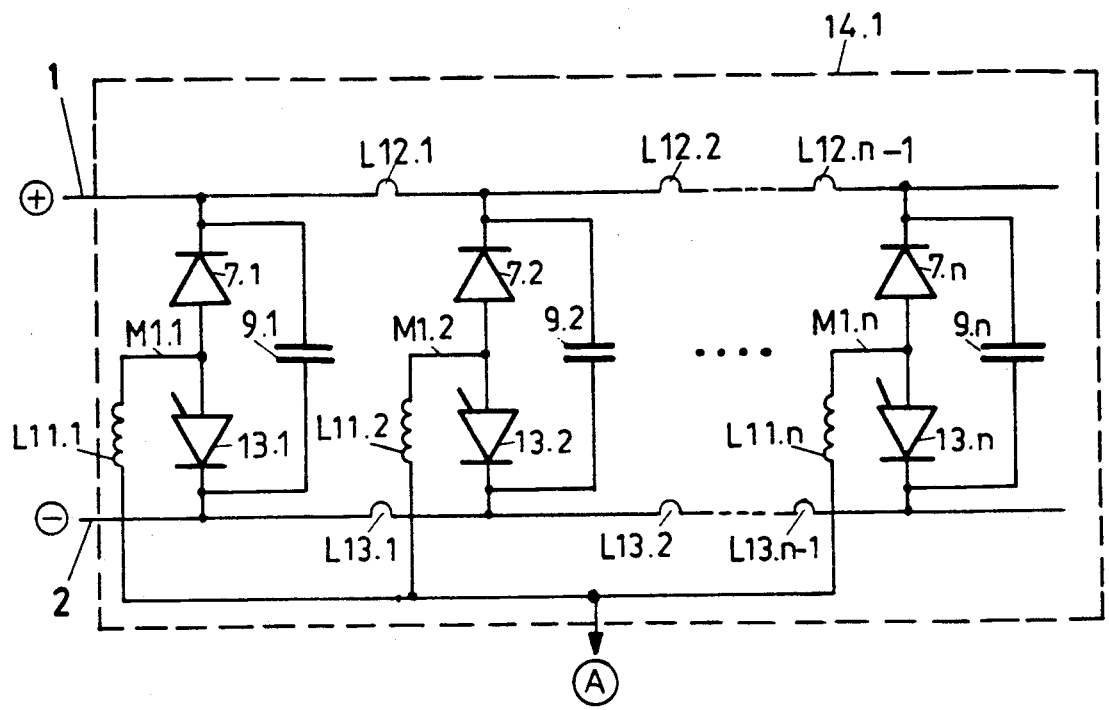
FIGS. 2a, b show a circuit arrangement for simple cooling.
Figure 2B:
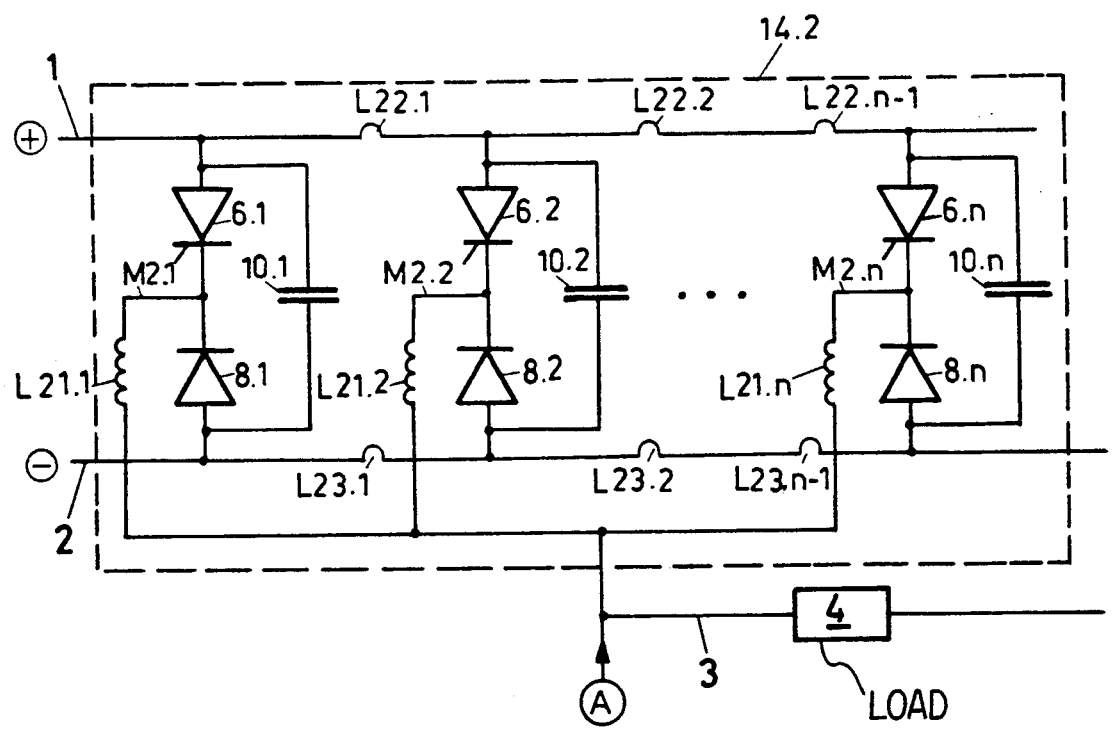

An embodiment which is particularly advantageous in this regard is shown in FIGS. 2a, b. While the HS arm (FIG. 2b) is constructed in principle just as in the first example (FIG. 1b), the LS arm (FIG. 2a) differs by the use of complementary turnoff semiconductor components 13.1, 13.1, ..., 13.n instead of the customary ones (5.1, 5.2, ..., 5.n in FIG. 1a). Complementary circuit-breakers are distinguished by the fact that the gate is provided on the anode side.

Particular preference is given in this regard to the CFCThs (complementary field controlled thyristor) such as are described, for example, in Swiss Patent Application CH-1940/90-5, not published prior to the date of filing the present application. The component pair FCTh/CFCTh has largely corresponding electrical parameters. Moreover, the two types of element can be triggered hard (i.e. without snubber).

The great advantage of the embodiment shown in FIGS. 2a, b resides in that both in the HS arm (FIG. 2b) and in the LS arm (FIG. 2a) the parallel semiconductor components 6.1, 6.2, ..., 6.n and 13.1, 13.2, ..., 13.n, respectively, can be soldered with their non-structured side (i.e. with the anode in the case of the FCTh, and with the cathode in the case of the CFCTh) directly onto the corresponding rail of the supply lines (1 and 2, respectively). As a result, the components are in good thermal contact with one another. Here, again, the undesired inductors $L12.1, L12.2, ..., L12.n-1$ and $L22.1, L22.2, ..., L22.n-1$, respectively, (in the positive supply line 1) and the inductors $L13.1, L13.2, ..., L13.n-1$ and $L23.1, L23.2, ..., L23.n-1$, respectively (in the negative supply line 2) are optimally small.

It is preferable for the components (semiconductor component, freewheeling diode and clamping capacitor) of a quarter-bridge arm to be accommodated in a common housing 14.1, 14.2, which affords protection against atmospheric influences. That is to say, the individual housings of the LS and HS modules 11.1, ..., 11.n and 12.1, ..., 12.n, respectively (FIGS. 1a, b) are eliminated in favor of a cost-effective housing 14.1 and 14.2, respectively (FIGS. 2a, b), which can consist of easily workable sheet metal.

In order to guarantee a balanced static current distribution in the parallel current paths, a resistor R1.1, R1.2, ..., R1.n, R2.1, R2.2, ..., R2.n can be provided in each case with the current-limiting inductor (FIGS. 1a, b). Its value is dimensioned such that at full load a voltage drop of 0.1 to 1 V, preferably 0.2 to 0.5 V, results.

Figure 3:
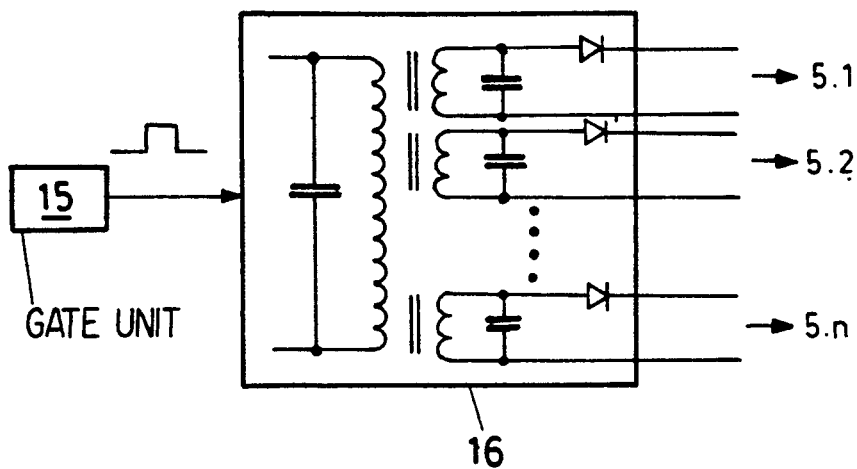
FIG. 3 shows a common gate unit with electrically isolating RF transformer.

FIG. 3 shows a common gate unit 15 that generates electrically isolated gate signals. A rectangular pulse, for example, is applied at the input of an RF transformer 16 and is transformed into various potentials in a manner known per se. The parallel outputs lead to the gate terminals of the MOSFETs, which trigger the turnoff semiconductor components of a quarter-bridge arm in the conventional manner or in accordance with the cascode circuit known from EP-0,260,471 (for example to the components 5.1, 5.2, ..., 5.n).

The preferred cascode circuit is distinguished by a parallel circuit of a zener diode and a capacitor, which is arranged between the gate of the semiconductor component, on the one hand, and an electrode of a MOSFET connected to the cathode, on the other hand.

The RF transformer 16 can itself be used for complete electrical isolation, or be triggered by an electrically isolating fiber optic connection.

When the transient current distribution is balanced by the inductors $L11.1, ..., L11.n, L21.1, ..., L21.n$, it is particularly simple to determine the loading of a turnoff semiconductor component. According to the invention, a voltage measuring device, such as the device 22 schematically illustrated in FIG. 1a connected in parallel with only one of the inductors L11.n, is provided for each current path to measure the voltage present at the respective inductor. Integration of the voltage over time yields the current flowing (or the component which has changed within the integration time) in a known way. A signal based on this measurement can then be used for the overcurrent detection.

Apart from the particularly preferred FCTh and CFCTh, respectively, all fast, snubber-free switches having low storage times (operating time <200 ns) are suitable in principle as turnoff semiconductor components. These include, for example, the finely structured GTO (see Patent Application CH-1940/90-50) or—for lower voltages—the IGBT (insulated gate bipolar transistor).

In order for the whole bridge circuit not to become inoperable in the event of failure of one of the parallel modules, it is expedient for each module to be provided between the midpoint and the load terminal with a fuse 17.1, 17.2, ..., 17.n, 18.1, 18.2, ..., 18.n (FIGS. 1a, b), which blows in the event of a defect in the semiconductor component. Because of the redundancy (safety margin) the bridge circuit then continues nevertheless to function unhesitatingly. The fuse can serve at least partially (if not entirely) to balance the static current distribution.

The inductor L11.1, resistor R1.1 and fuse 17.1, respectively, can each be arranged optionally in the quarter-bridge module or outside thereof. From the point of view of the user it is, of course, advantageous if what he has to provide as standard in his circuit in any case (for example current-limiting inductor, etc.) is already integrated in the single module.

Figure 4:
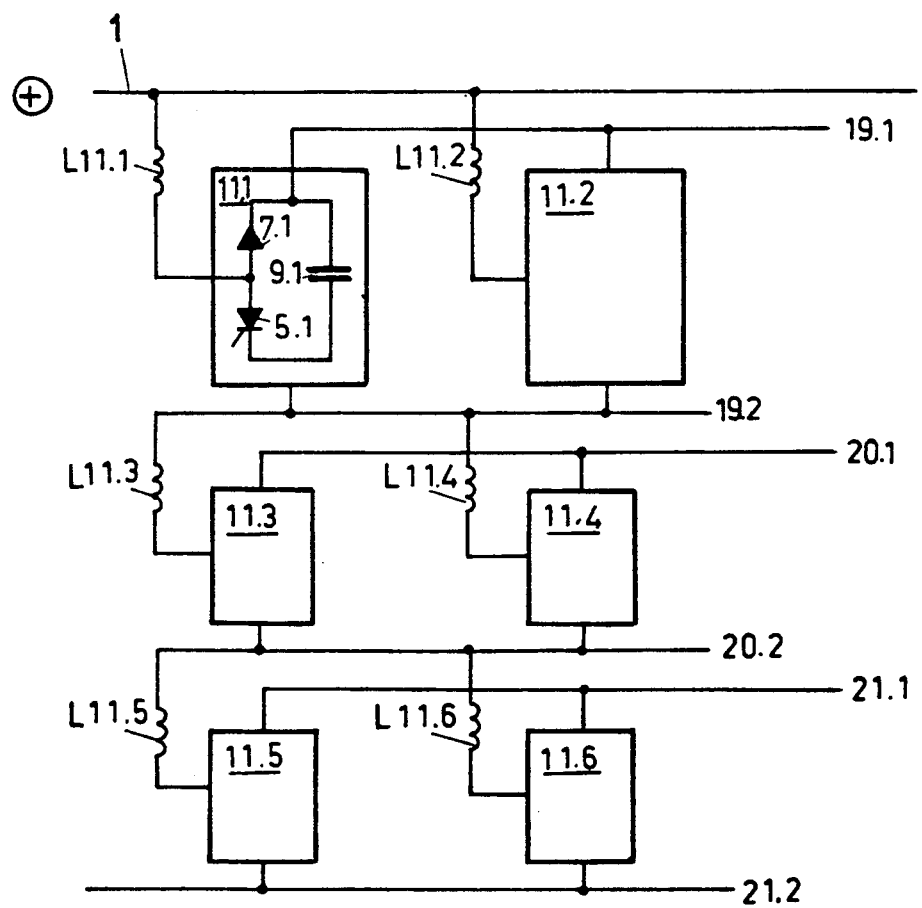
FIG. 4 shows a series/parallel circuit arrangement.

Finally, FIG. 4 shows a series/parallel bridge circuit as suited for processing high voltages. For the sake of simplicity, three stages with in each case two parallel LS modules 11.1 and 11.2, 11.3 and 11.4, 11.5 and 11.6 are shown. The midpoints of the two uppermost LS modules 11.1 and 11.2 are hooked up via the current-limiting inductors L11.1 and L1.2, respectively, to the positive supply line 1 (input). The module terminals, to which the turnoff semiconductor components are directly hooked with their cathodes in each case, are connected in a low-inductive fashion to a current rail 19.2 (output of the first stage). The remaining module terminals (cathodes of the freewheeling diodes) are likewise connected in parallel to a current rail 19.1.

The midpoints (input) of the next stage (LS modules 11.3, 11.4) are hooked up, in turn, via inductors L11.3, L11.4 to the current rail 19.2 (output of the preceding stage). Two current rails 20.1, 20.2 are provided analogously to the first stage.

The third stage (LS modules 11.5, 11.6) is connected analogously. The current rail 21.2 is then the output of the entire series/parallel circuit of the quarter-bridge modules.

The individual arms are thus connected to one another overall in such a way that a series circuit of the turnoff semiconductor components 5.1, ... results. The inductors L11.1, ... serve to limit the rate of current rise both in the parallel arms and in the entire series arm. The freewheeling diodes 7.1, ... and the clamping capacitors 9.1, ... serve either to limit the voltage at the respective semiconductor component 5.1, ... (the capacitors then remain always at least partially charged) or as snubbers (the capacitors are then discharged during the operating time of the turnoff components).

The LS modules 11.1, ..., 11.6 used in the present exemplary embodiment can be constructed in accordance with those shown in FIG. 1. In this case, the freewheeling diode and the clamping capacitor limit the voltage both when there is delayed turn-on and when there is premature turnoff of the corresponding group of elements. In this arrangement, the diode and the capacitor can be used both as overvoltage protection (the capacitor is then always charged) and as snubber (the capacitor is then periodically discharged).

However, the turnoff semiconductor component is preferably triggered by means of a cascode circuit in which a MOSFET is connected in series with the turnoff semiconductor component and serves to balance the static current distribution by means of its channel resistance. Such a MOSFET 23 is shown, by way of example, connected in series with the component 5.n shown in FIG. 1a. In this case, the triggering has a particularly simple configuration, since because of the negligibly small control powers there is no need to provide each of the gates, which are at greatly differing potentials, with its own supply unit.

Considered overall, the following factors lead to a reduction in costs:

1. Use of standard components which can be employed in all market sectors from, for example, 200 A up to over 3 kA.

2. There is no need for complicated clamping. Inexpensive soldering technology can be used on small to medium chips.

3. Simple and, if necessary even electrically isolated, cooling is possible.

4. The bridge circuit according to the invention can process the highest currents. The costs bound up with the development of powerful components are avoided.

5. Due to the direct solder contact between chip and heat sink a much smaller heat transfer resistance results than can be realized in the prior art in the normal (customary for high-power design) pressure contact housing.

6. A simple, highly effective protective concept is used.

Finally, it can be maintained that the invention opens a novel avenue to realizing a powerful circuit arrangement central to many fields of application.

LIST OF DESIGNATIONS

1—positive supply line; 2—negative supply line; 3—load terminal; 4—load; 5.1, . . . , 5.n—turnoff semiconductor component; 6.1, . . . , 6.n—turnoff semiconductor component; 7.1, . . . , 7.n—freewheeling diode; 8.1, . . . , 8.n —freewheeling diode; 9.1, . . . , 9.n—clamping capacitor; 10.1, . . . , 10.n—clamping capacitor; 11.1, . . . , 11.n—LS module; 12.1, . . . , 12.n—HS module; 13.1, . . . , 13.n—complementary semiconductor component; 14.1, 14.2 —housing; 15—gate unit; 16—RF transformer; 17.1, . . . , 17.n—fuse; 18.1, . . . , 18.n—fuse; 19.1, 19.2, 20.1, 20.2, 21.1, 21.2—current rail; L11.1, . . . , L11.n, L21.1, . . . , L21.n—inductor for limiting the rate of current rise; L12.1, . . . , L12.n−1, L13.1, . . . , L13.n−1, L22.1, . . . , L22.n−1, L23.1, . . . , L23.n−1—undesired inductors in the supply lines; M1.1, . . . , M1.n, M2.1, . . . , M2.n—midpoints.

Obviously, numerous modifications and variations of the present invention are possible in light of the above teachings. It is therefore to be understood that within the scope of the appended claims, the invention may be practiced otherwise than as specifically described herein.

WHAT IS CLAIMED AS NEW AND DESIRED TO BE SECURED BY LETTERS PATENT OF THE UNITED STATES IS:

1. A quarter-bridge circuit for high currents, comprising a plurality of turn-off semiconductor components (5.1, . . . , 5.n; 6.1, . . . , 6.n) that can be turned off via a gate in each case and one freewheeling diode (7.1, . . . , 7.n; 8.1, . . . , 8.n) each, located opposite a midpoint (M1.1, . . . , M1.n; M2.1, . . . , M2.n), so that a total current in the quarter-bridge circuit is subdivided into a plurality of parallel current paths, wherein a) for each current path essentially one assigned clamping capacitor (9.1, . . . , 9.n; 10.1, . . . , 10.n) is arranged in parallel with the freewheeling diode (7.1, . . . , 7.n; 8.1, . . . , 8.n) and the turnoff semiconductor component (5.1, . . . , 5.n; 6.1, . . . , 6.n) in such a way that the respective freewheeling path has as minimal an inductance as possible overall, and b) there is provided between a load terminal (3) of the quarter-bridge circuit and each midpoint (M1.1, . . . , M1.n; M2.1, . . . , M2.n) of the current paths one inductor (L11.1, . . . , L11.n, L21.1, . . . , L21.n) each which limits the rate of current rise, so that a current rush caused by an operating delay does not overload the turnoff semiconductor component (5.1, . . . , 5.n; 6.1, . . . , 6.n).

2. The quarter-bridge circuit as claimed in claim 1, wherein the inductor (L11.1, . . . , L11.n, L21.1, . . . , L21.n) limiting the rate of current rise is additionally dimensioned in each case as a back-up fuse such that in the event of a short circuit the current does not exceed the maximum turnoff current within the time span given by the detection time and the operating delay.

3. The quarter-bridge circuit as claimed in claim 1, wherein the turnoff semiconductor components (5.1, . . . , 5.n; 6.1, . . . , 6.n, respectively) belonging to the same quarter-bridge arm are triggered by a common gate unit (15) that is electrically isolated with regard to the particular gate.

4. The quarter-bridge circuit as claimed in claim 1, wherein in order to balance the static current distribution in the parallel current paths a resistor is provided, in series in each case, which is preferably at least partially formed by a fuse.

5. The quarter-bridge circuit as claimed in claim 1, wherein the turnoff semiconductor components (5.1, . . . , 5.n; 6.1, . . . , 6.n) are part of a cascode circuit, at least one MOSFET being connected in each case in series to the turnoff semiconductor components (5.1, . . . , 5.n; 6.1, . . . , 6.n), which MOSFET simultaneously serves by means of its channel resistance to balance the static current distribution.

6. The quarter-bridge circuit as claimed in claim 1, wherein for the purpose of detecting the loading of a turnoff semiconductor component means are provided which measure the voltage present at the respective inductor (L11.1, . . . , L11.n, L21.1, . . . , L21.n).

7. A quarter-bridge circuit as claimed in claim 1, wherein the turnoff semiconductor components (5.1, . . . , 5.n; 6.1, . . . , 6.n, respectively are field controlled thyristors or complementary field controlled thyristors.

8. The quarter-bridge circuit as claimed in claim 1, wherein in order to minimize the inductance (L12.1, . . . , L12.n−1, L13.1, . . . , L13.n−1, L22.1, . . . , L22.n−1, L23.1, . . . , L23.n−1) between the parallel current paths, the corresponding turnoff semiconductor components (5.1, . . . , 5.n; 6.1, . . . , 6.n, respectively) of a quarter-bridge arm are mounted with a non-structured main electrode on a common current rail.

9. The quarter-bridge circuit as claimed in claim 8, wherein the turnoff semiconductor components (5.1, . . . , 5.n; 6.1, . . . , 6.n, respectively), the freewheeling diodes (7.1, . . . , 7.n; 8.1, . . . , 8.n) and the clamping capacitors (9.1, . . . , 9.n; 10.1, . . . , 10.n) of the parallel current paths are accommodated unenclosed in a common housing with good mutual thermal contact.

10. A circuit arrangement, wherein a plurality of quarter-bridge circuits, as claimed in claim 1 are interconnected in such a way that
   a) a series connection of the turnoff semiconductor components (5.1, ...) results,
   b) the inductors (L11.1, ...) serve to limit the rate of current rise both in the parallel arms and in the series arm, and
   c) the freewheeling diodes (7.1, ...) and the clamping capacitors (9.1, ...) serve either to limit the voltage at the respective semiconductor component (5.1, ...) or as a snubber.

* * * * *